United States Patent
Chen et al.

(10) Patent No.: US 7,872,334 B2
(45) Date of Patent: Jan. 18, 2011

(54) CARBON NANOTUBE DIODES AND ELECTROSTATIC DISCHARGE CIRCUITS AND METHODS

(75) Inventors: Jia Chen, Ossining, NY (US); Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/744,234

(22) Filed: May 4, 2007

(65) Prior Publication Data

US 2008/0273280 A1 Nov. 6, 2008

(51) Int. Cl.
*H01L 51/30* (2006.01)
(52) U.S. Cl. .................. 257/653; 257/E51.04; 977/750
(58) Field of Classification Search ............. 257/E51.04
See application file for complete search history.

(56) References Cited

U.S. PATENT DOCUMENTS

| | | | | |
|---|---|---|---|---|
| 6,128,214 | A * | 10/2000 | Kuekes et al. | 365/151 |
| 6,445,006 | B1 * | 9/2002 | Brandes et al. | 257/76 |
| 6,781,166 | B2 * | 8/2004 | Lieber et al. | 257/211 |
| 6,963,077 | B2 * | 11/2005 | DeHon et al. | 257/9 |
| 7,026,911 | B2 * | 4/2006 | Aono et al. | 338/309 |
| 2003/0213978 | A1 * | 11/2003 | Voldman | 257/200 |
| 2004/0067530 | A1 * | 4/2004 | Gruner | 435/7.1 |
| 2004/0149978 | A1 * | 8/2004 | Snider | 257/3 |
| 2005/0000830 | A1 * | 1/2005 | Glatkowski et al. | 205/775 |
| 2006/0172521 | A1 * | 8/2006 | Snider | 438/597 |
| 2007/0071668 | A1 * | 3/2007 | Mouli et al. | 423/447.3 |

OTHER PUBLICATIONS

Collins, et al.; Engineering Carbon Nanotubes and Nanotube Circuits Using Electrical Breakdown; Science, vol. 292; Apr. 27, 2001; www.sciencemag.org; pp. 706-709.
Collins, et al.; Current Saturation Electrical Breakdown in Multiwalled Carbon Nanotubes; The American Physical Society; Physical Review Lertters, vol. 86, No. 14; Apr. 2, 2001; pp. 3128-3131.
Zhang, et al.; Selective Etching of Metallic Carbon Nanotubes by Gas-Phase Reaction; Science, vol. 314; Nov. 10, 2006; www.sciencemag.org; pp. 974-977.
Zhang, et al.; Supporting Online Material for "Selective Etching of Metallic Carbon Nanotubes by Gas-Phase Reaction for Scalable Electronics"; Science AAAS; www.sciencemag.org/cgi/content/full/314/5801/974/DC1; pp. S1-S7.

* cited by examiner

*Primary Examiner*—Sue Purvis
*Assistant Examiner*—Benjamin P Sandvik
(74) *Attorney, Agent, or Firm*—Schmeiser, Olsen & Watts; Richard M. Kotulak

(57) ABSTRACT

Diodes and method of fabricating diodes. A diode includes: an p-type single wall carbon nanotube; an n-type single wall carbon nanotube, the p-type single wall carbon nanotube in physical and electrical contact with the n-type single wall carbon nanotube; and a first metal pad in physical and electrical contact with the p-type single wall carbon nanotube and a second metal pad in physical and electrical contact with the n-type single wall carbon nanotube.

20 Claims, 7 Drawing Sheets

CARBON NANOTUBE DIODES AND ELECTROSTATIC DISCHARGE CIRCUITS AND METHODS

FIELD OF THE INVENTION

The present invention relates to the field of electronic devices; more specifically, it relates to carbon nanotube (CNT) diodes, electrostatic discharge (ESD) circuits using CNT diodes and the method of fabricating the CNT diodes and ESD circuits.

BACKGROUND OF THE INVENTION

The search for ever faster, lower power consuming and thus smaller electronic devices is leading to structures having geometries of width and length smaller than current semiconductor image forming technology can generate. Of particular interest are structures formed from carbon-nanotubes such as quantum dots, CNT wires and CNT field effect transistors (CNTFETs). Circuits constructed using CNTFETs and CNT wires will require ESD protection and structures and methods for providing such protection are virtually unknown. Accordingly, there exists a need in the art to for compatible CNT diodes and ESD circuits for protecting CNT based electronic devices.

SUMMARY OF THE INVENTION

A first aspect of the present invention is a diode, comprising: a p-type single wall carbon nanotube; an n-type single wall carbon nanotube, the p-type single wall carbon nanotube in physical and electrical contact with the n-type single wall carbon nanotube; and a first metal pad in physical and electrical contact with the p-type single wall carbon nanotube and a second metal pad in physical and electrical contact with the n-type single wall carbon nanotube.

A second aspect of the present invention is a diode, comprising: a multiplicity of p-type single wall carbon nanotubes; a multiplicity of n-type single wall carbon nanotubes, each of the p-type single wall carbon nanotubes in physical and electrical contact with one or two of the n-type single wall carbon nanotubes and each of the n-type single wall carbon nanotubes in physical and electrical contact with one or two of the p-type single wall carbon nanotubes; and a first metal pad in physical and electrical contact with every p-type single wall carbon nanotube of the multiplicity of p-type single wall carbon nanotubes and a second metal pad in physical and electrical contact with every n-type single wall carbon nanotube of the multiplicity of p-type single wall carbon nanotubes.

A third aspect of the present invention is a diode array, comprising: a multiplicity of p-type single wall carbon nanotubes spaced apart, extending in a first lengthwise direction and parallel to each other in a first layer; a multiplicity of n-type single wall carbon nanotubes spaced apart, extending in a second lengthwise direction and parallel to each other in a second layer, the first lengthwise direction about perpendicular to the second lengthwise direction; first metal pads in physical and electrical contact with respective p-type single wall carbon nanotubes of the multiplicity of p-type single wall carbon nanotubes and second metal pad in physical and electrical contact with respective n-type single wall carbon nanotubes of the multiplicity of p-type single wall carbon nanotubes; and wherein each p-type single wall carbon nano-tube of the multiplicity of p-type single wall carbon nano-tubes crosses each n-type single wall carbon nano-tube of the multiplicity of n-type single wall carbon nano-tubes at included angles of greater than zero but no greater than 90 degrees, the p-type single wall carbon nanotubes in physical and electrical contact with the n-type single wall carbon nano-tubes where the p-type single wall carbon nanotubes cross the n-type single wall carbon nanotubes.

A fourth aspect of the present invention is an electrostatic discharge circuit, comprising: a first diode according to the diode of the first aspect and a second diode according to diode of the first aspect; a cathode of a the first diode connected to a high voltage terminal of a power source and an anode of the second diode connected to a low voltage terminal of the power source; an input pad connected to the anode of the first diode, to a cathode of the second diode and to circuits to be protected.

A fifth aspect of the present invention is an electrostatic discharge circuit, comprising: a first diode according to the diode of the second aspect and a second diode according to the diode of the second aspect; a cathode of a the first diode connected to a high voltage terminal of a power source and an anode of the second diode connected to a low voltage terminal of the power source; an input pad connected to the anode of the first diode, a cathode of the second diode and to circuits to be protected.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Carbon nanotubes are closed-cage molecules composed of $sp^2$-hybridized carbon atoms arranged in hexagons and pentagons. Carbon nanotubes come in two types, single wall nanotubes, which are hollow tube like structures or and multi-wall nanotubes. Multi-wall carbon nanotubes resemble sets of concentric cylinders. The present invention utilizes single-wall carbon nanotubes (SWNT). For the purposes of the present invention, the term carbon nanotube (CNT) denotes a carbon SWNT.

Electrostatic discharge is the sudden and momentary electric current that flows between two objects at different electrical potentials. In electronic devices are particularly sensitive to ESD events occurring on the input and output pins. ESD protection circuits are connected to input and output pins to direct ESD current to, for example, ground rather than allowing the current to propagate to the circuits connected to the pins.

Figure 1A:
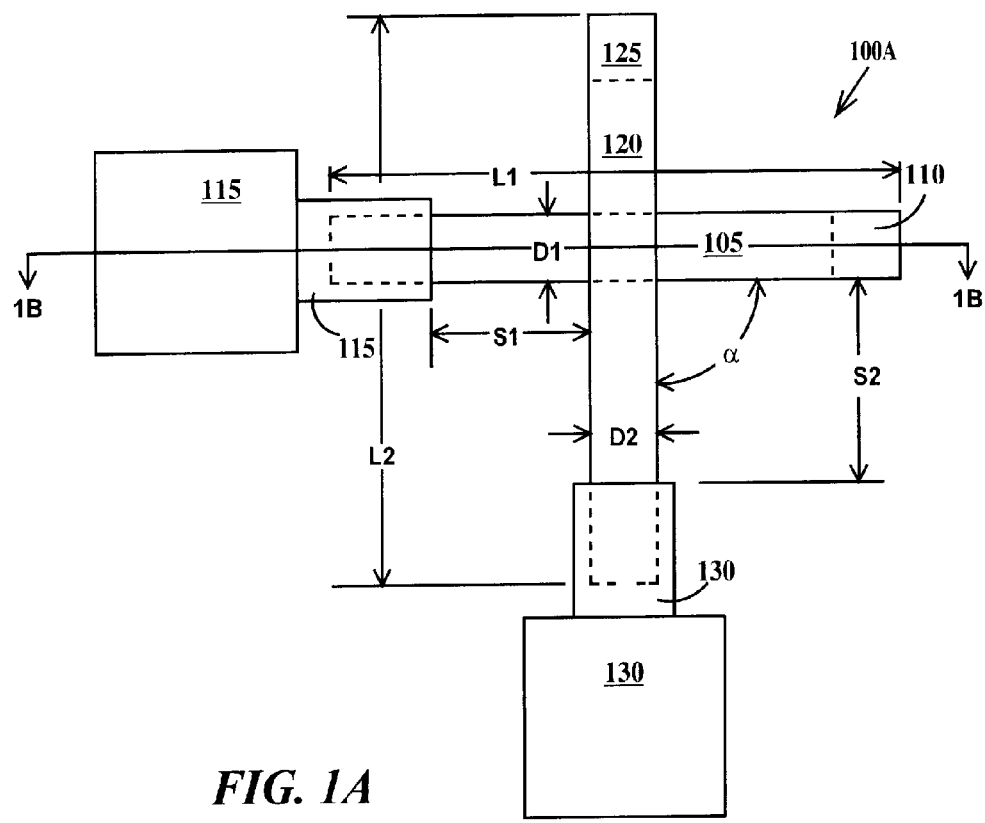
FIG. 1A is a top view and FIG. 1B is a section view through line 1B-1B of FIG. 1A of a first CNT diode is according to the present invention.
Figure 1B:
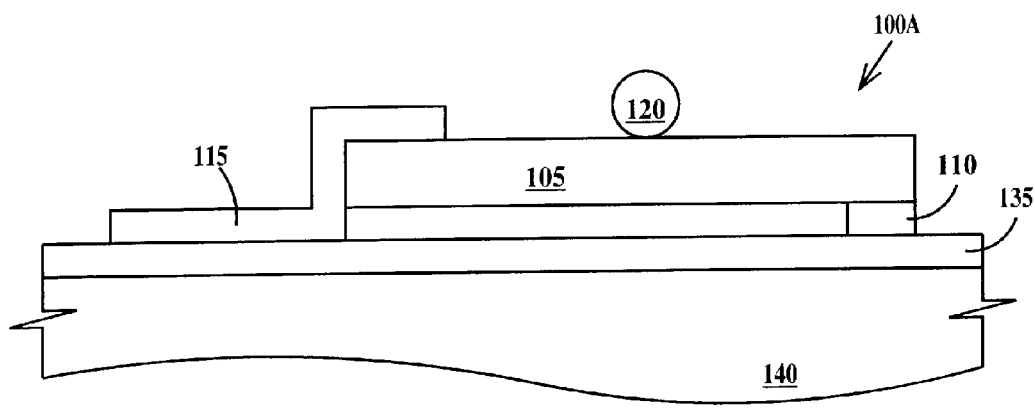

FIG. 1A is a top view and FIG. 1B is a section view through line 1B-1B of FIG. 1A of a first CNT diode is according to the present invention. In FIGS. 1A and 1B, a CNT diode 100A includes a first CNT 105 extending in a first lengthwise direction from a catalytic nano-particle 110 and electrically contacted by a metal contact 115 at an end opposite the end in contact with the catalytic nano-particle. CNT diode 100A further includes a second CNT 120 extending in a second lengthwise direction from a catalytic nano-particle 125 and electrically contacted by a metal contact 130 at an end opposite the end in contact with the catalytic nano-particle. In FIGS. 1A and 1B, CNTs 105 and 120 lie in two different but parallel planes that are both parallel to a plane defined by a top surface of an insulating layer 135.

Through not shown in FIGS. 1A and 1B, contact pad 115 may be formed on the same end of CNT 105 as catalytic nano-particle 110. Though not shown in FIGS. 1A and 1B, contact pad 130 may be formed on the same end of CNT 120 as catalytic nano-particle 125 (see FIGS. 2A and 2B). Through not shown in FIGS. 1A and 1B contact pad 115 may be formed in a middle region of CNT 105 between its opposite ends. Through not shown in FIGS. 1A and 1B contact pad 10 may be formed in a middle region of CNT 130 between its opposite ends. Thus, there are three possible positions for each contact and nine possible combinations of contact positions for both contacts together.

CNTs 105 and 120 cross at an included angle α and electrically contact each other where they cross. CNT diode 100A is formed on insulating layer 135, which in turn is formed on a substrate 140. Catalytic nano-particles 110 and 125 and metal contacts 115 and 130 are in contact with insulating layer 135. Catalytic nano-particles 110 and 125 are, in one example, iron/cobalt (Fe/Co) or iron/cobalt/nickel (Fe/Co/Ni) when CNTs 105 and 120 are formed by chemical vapor deposition (CVD) from carbon containing gases, e.g. a carbon monoxide (CO) and hydrogen ($H_2$) mixture.

CNT 105 has a length L1 and a diameter D1 and CNT 120 has a length L2 and a diameter D2. L1 and L2 are independently between about tens of nm and about a few cm. D1 and D2 are independently between about 0.5 nm and about 5 nm. Contact 115 is spaced a distance S1 from CNT 120 and contact 130 is spaced a distance S2 from CNT 120. S1 and S2 are independently between about 0.5 nm and about a few cm.

In one example, CNT 105 is a p-type CNT and CNT 120 an n-type CNT. Alternatively, CNT 120 is a p-type CNT and CNT 105 an n-type CNT. CNTs are naturally p-type and there are several methods for making CNTs n-type or more strongly p-type. Contact with palladium (Pd) makes a CNT p-type (majority carriers are holes). Pd has a high work function and physical and electrical contact of a CNT with Pd creates a Schottky barrier that is higher for electrons than for holes. Contact with aluminum (Al) makes a CNT n-type (majority carriers are electrons). Al has a low work function and physical and electrical contact of a CNT with Al creates a Schottky barrier that is higher for holes than for electrons. When CNT 105 is to be n-type and CNT 120 is to be p-type, contact 115 may be formed from Pd and contact 130 from Al. When CNT 120 is to be p-type and CNT 105 is to be n-type, contact 130 may be formed from Pd and contact 115 from Al. It is advantageous, when the doping of CNTs 105 and 120 are by selection of the metal used in contacts 115 and 130, that distances S1 and S2 be as small as possible.

Another method to dope CNTs is by forming a charge transfer complex coating on the CNTs. In one example, CNT may be made n-type by chemically coating it with amine rich polymer, for example polyethylene amine. In one example, the amine rich polymer layer is a monolayer. In one example, CNT made be made more p-type by treating the CNT by forming a charge-transfer complex (that charges the CNT positive) on the surface of the CNT. One method of forming a charge transfer complex on a CNT is by immersion of the CNT in a solution of triethyoxnium hexachloroantimoate $(C_2H_5)_3O^+SbCl_6^-$ followed by rinsing appropriate solvents. When CNTs 115 are doped chemically, contacts 115 and 130 may be formed from metals such as titanium (Ti), tantalum (Ta), copper (Cu) or tungsten (W), though Pd and Al may still be used in combination with chemical coating, Pd on the chemically p-doped CNT and Al on the chemically n-doped CNT. Ti, for example, has an intermediate work function (about 4.33 eV) and physical and electrical contact of a CNT with Ti creates a Schottky barrier that is about equal for holes and electrons.

The angle α formed by the crossing of CNTs 105 and 120 is greater then zero degrees and no greater than 90°.

One example fabrication of CNT diode 100A is as follows:

(1) Form first catalytic nano-particle 110 on insulating layer 135;

(2) Grow first CNT 115 by CVD with the reactant gases flowing in a first lengthwise direction;

(3) Form second catalytic nano-particle 125 on insulating layer 135;

(4) Grow first CNT 115 by CVD with the reactant gases flowing in the a lengthwise direction (the angle between the first and second lengthwise directions being a;

(5) Form first contact 115; and (6) Form second contact 130.

Optionally, after step (2) CNT 115 may be doped by chemical coating, in which case it may be advantageous to form a removable protective coating over CNT 115 prior to step (3). Optionally, after step (4) CNT 120 may be doped by chemical coating, in which case it may be advantageous to form a removable protective coating over CNT 115 prior to forming the doping chemical coating. Optionally, after step (2) CNT 105 may be doped by a first chemical coating and after step (4) CNT 120 may be doped by second chemical coating, in which case it may be advantageous to form a removable protective coating over CNT 115 prior to step (3) and remove a portion of the protective coating where second CNT 120 is expected to cross first CNT 105 prior to forming the second doping chemical coating.

Figure 4:
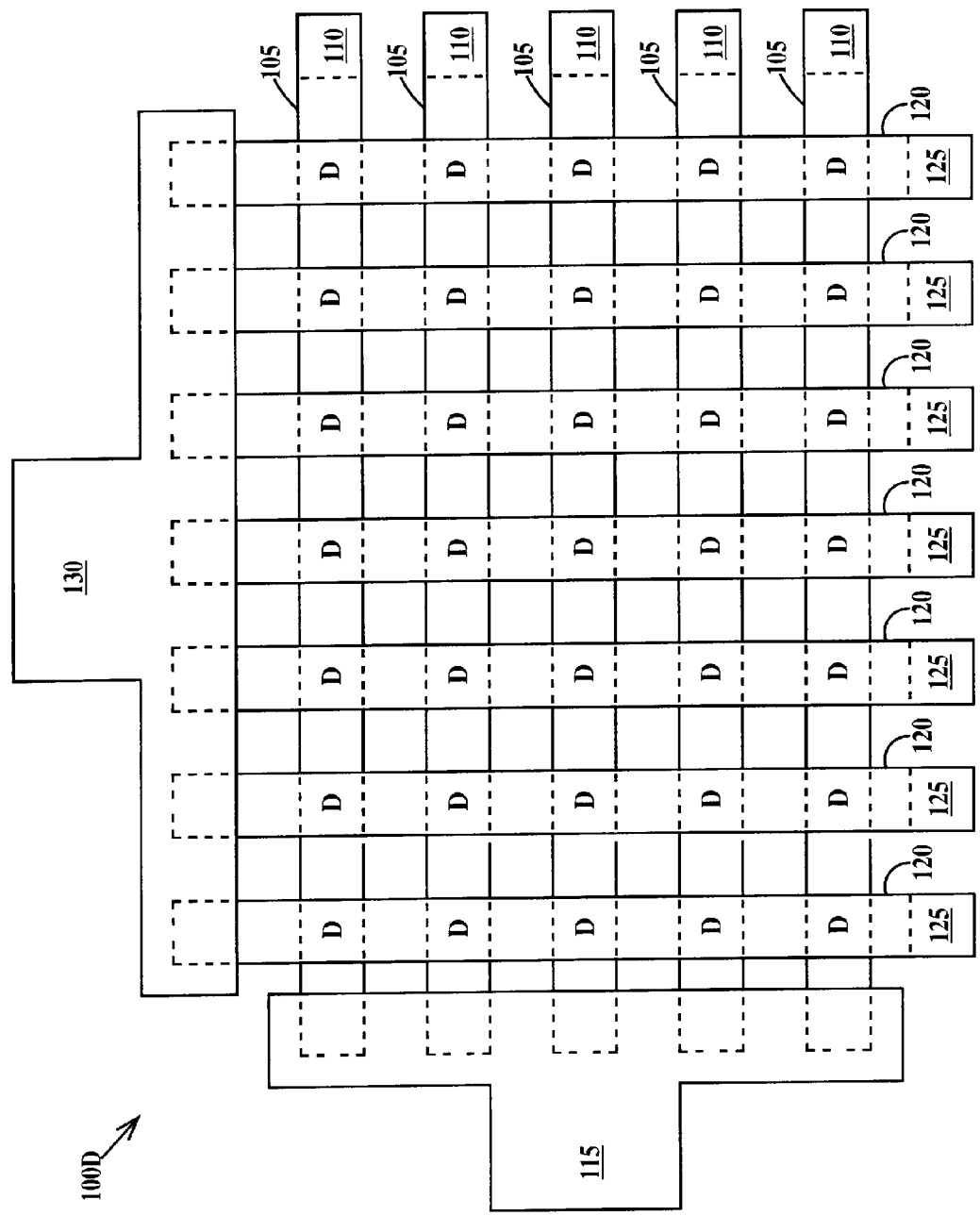
FIG. 4 is a top view of a fourth CNT diode is according to the present invention.
Figure 5:
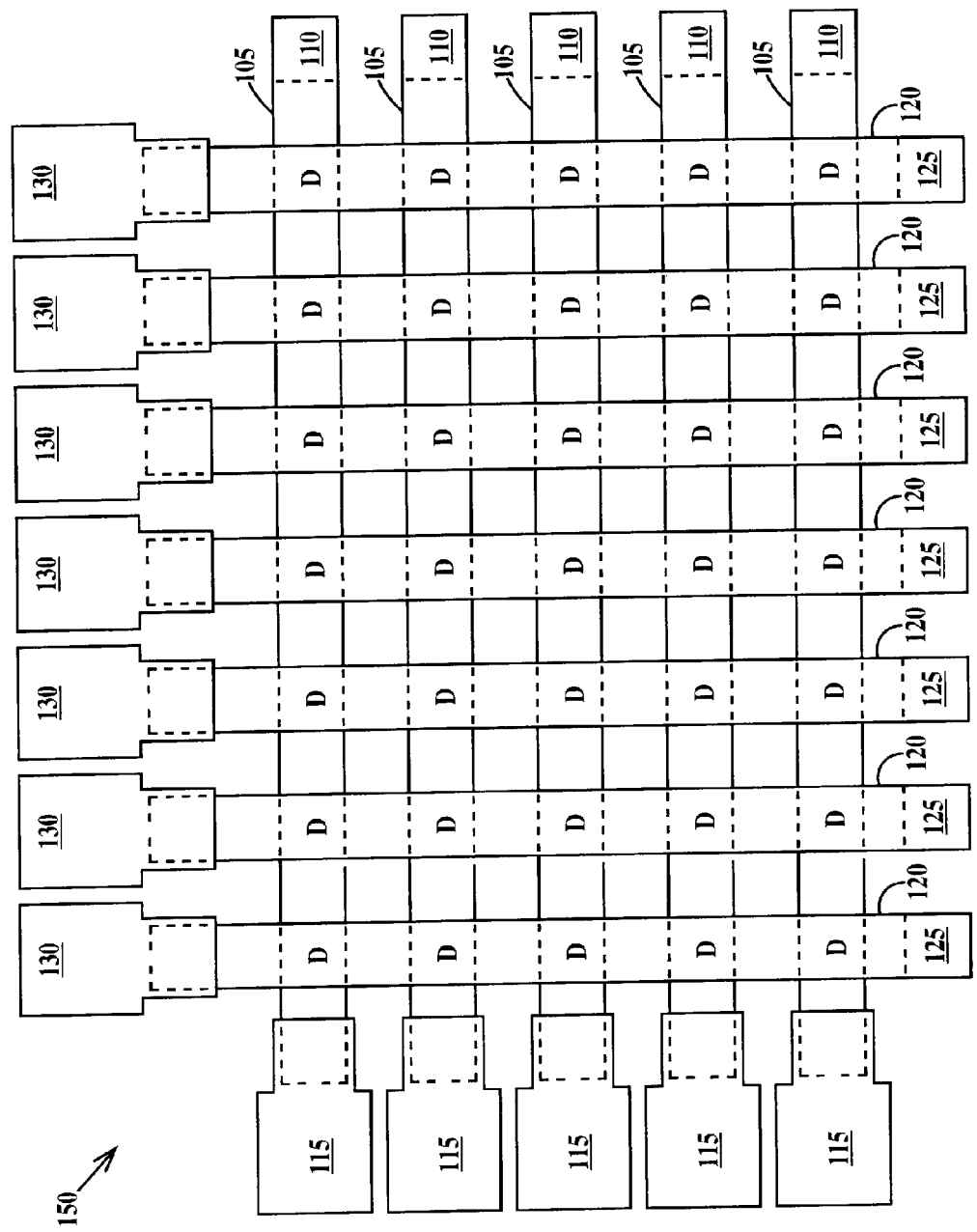
FIG. 5 is a top view of a CNT diode array according to the present invention.
Figure 6A:
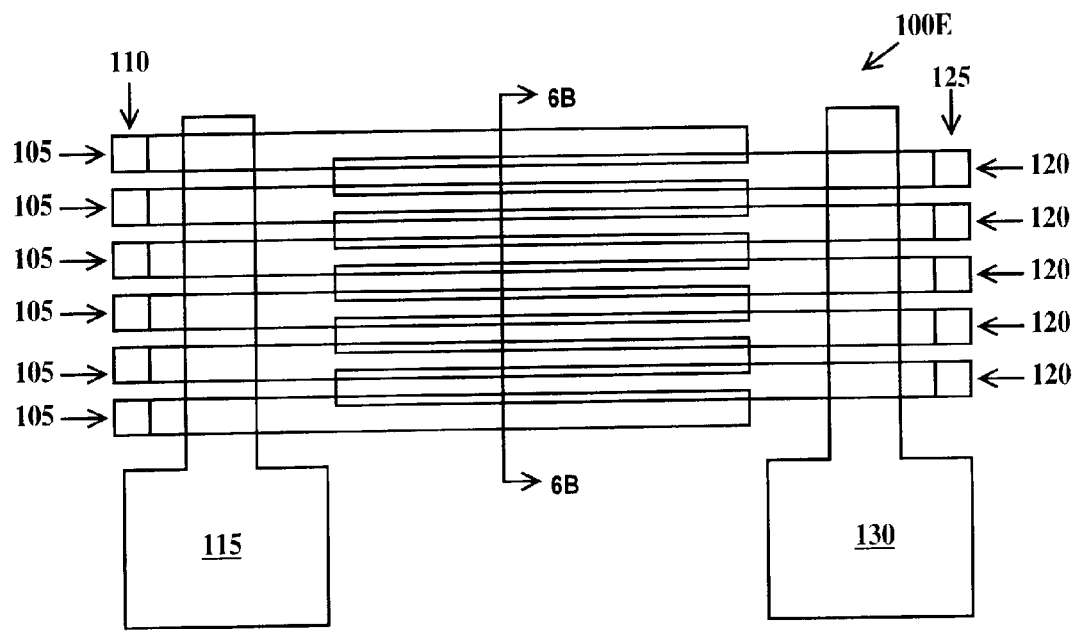
FIG. 6A is a top plan view and FIG. 6B is a section view through line 6B-6B of FIG. 6A of a fifth CNT diode is according to the present invention.
Figure 6B:
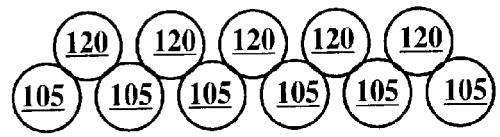

In fabricating CNT diodes 100D of FIG. 4, CNT array of FIG. 5 and CNT diode 100E of FIGS. 6A and 6B, which include multiple p-type and multiple n-type CNTs and are described infra, optional steps to remove any purely conductive (as opposed to semi-conductive CNTs) may be added after steps (2) and (4). In a first example, conductive CNTs may be removed by passing a high current (e.g. about 109 A/cm2) through the CNTs. In a second example, conductive CNTs may be removed by subjecting the CNTs to a (e.g. methane) plasma. Additional steps, to protect the CNTs formed in step (2) may be required.

In one example insulating layer 135 is $SiO_2$ and substrate 140 comprises single-crystal silicon. In a first example, insulating layer 135 and substrate 140 may be a included in an integrated circuit chip which includes devices such as CMOS FETs, bipolar transistors, PN junction and Schottky diodes, thin film and trench capacitors, FET and polysilicon resistors and metal inductors which are wired together along with CNT diode 105A (or any of CNT diodes 100B, 100C, 110D and 100E and CNT diode array 150, all described infra) to form integrated circuits. In a second example, insulating layer 135 and substrate 140 may be included in an integrated circuit chip which includes devices such as CNTFETs, CNT diodes, CNT capacitors, CNT resistors and CNT inductors which are wired together along with CNT diode 105A (or any of the CNT diodes 100B, 100C, 110D and 100E and CNT diode array 150, all described infra) to form integrated circuits. In a third example, insulating layer 135 and substrate 140 may be included in an integrated circuit chip which includes devices such as CMOS FETs, bipolar transistors, PN junction and Schottky diodes, thin film and trench capacitors, FET and polysilicon resistors and metal inductors, CNTFETs, CNT diodes, CNT capacitors, CNT resistors and CNT inductors which are wired together along with CNT diode 105A (or any of the CNT diodes 100B, 100C, 110D and 100E and CNT diode array 150, all described infra) to form integrated circuits. The wiring in either the first, second or third examples may comprise conventional semiconductor wiring techniques such as damascene wires and contacts, CNT wires or combinations thereof.

Figure 2A:
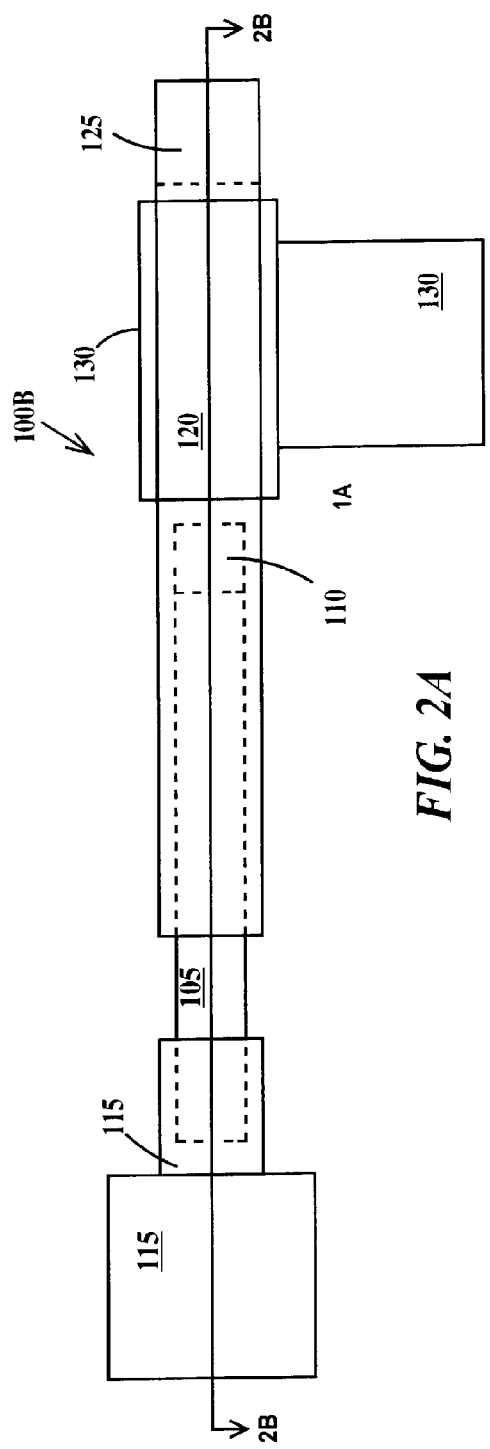
FIG. 2A is a top view and FIG. 2B is a section view through line 2B-2B of FIG. 2A of a second CNT diode is according to the present invention.
Figure 2B:
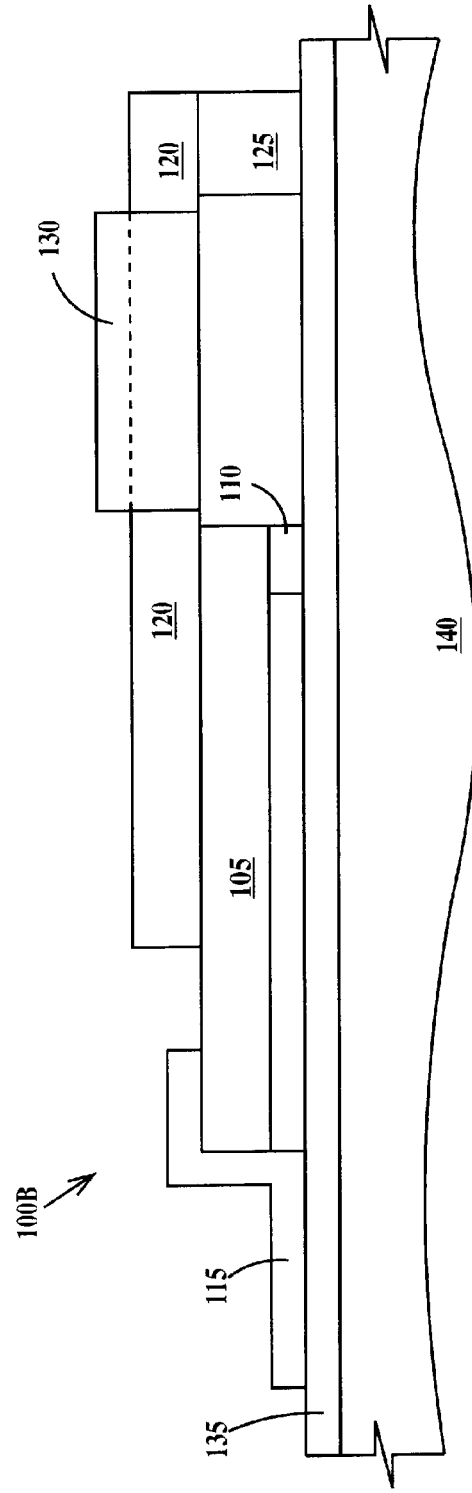

FIG. 2A is a top view and FIG. 2B is a section view through line 2B-2B of FIG. 2A of a second CNT diode is according to the present invention. In FIGS. 2A and 2B, a CNT diode 100B is similar to CNT diode 100A of FIGS. 1A and 1B, except instead of CNTs 105 and 110 crossing each other at an included angle α, they are parallel to each other (i.e. α=0°) with CNT 120 on top of CNT 105 and they are in electrical contact along a portion of the length of each CNT. In FIGS. 2A and 2B, CNTs 105 and 120 lie in a same plane that is perpendicular to the plane defined by the top surface of an insulating layer 135.

It will be noted that contact 130 contacts CNT 120 in a middle region of CNT between its opposite ends. Contact 130 may contact CNT 120 over the end of the CNT over catalytic nano-particle 125. Fabrication of CNT diode 100B is similar to fabrication of CNT diode 100A described supra.

Figure 3:
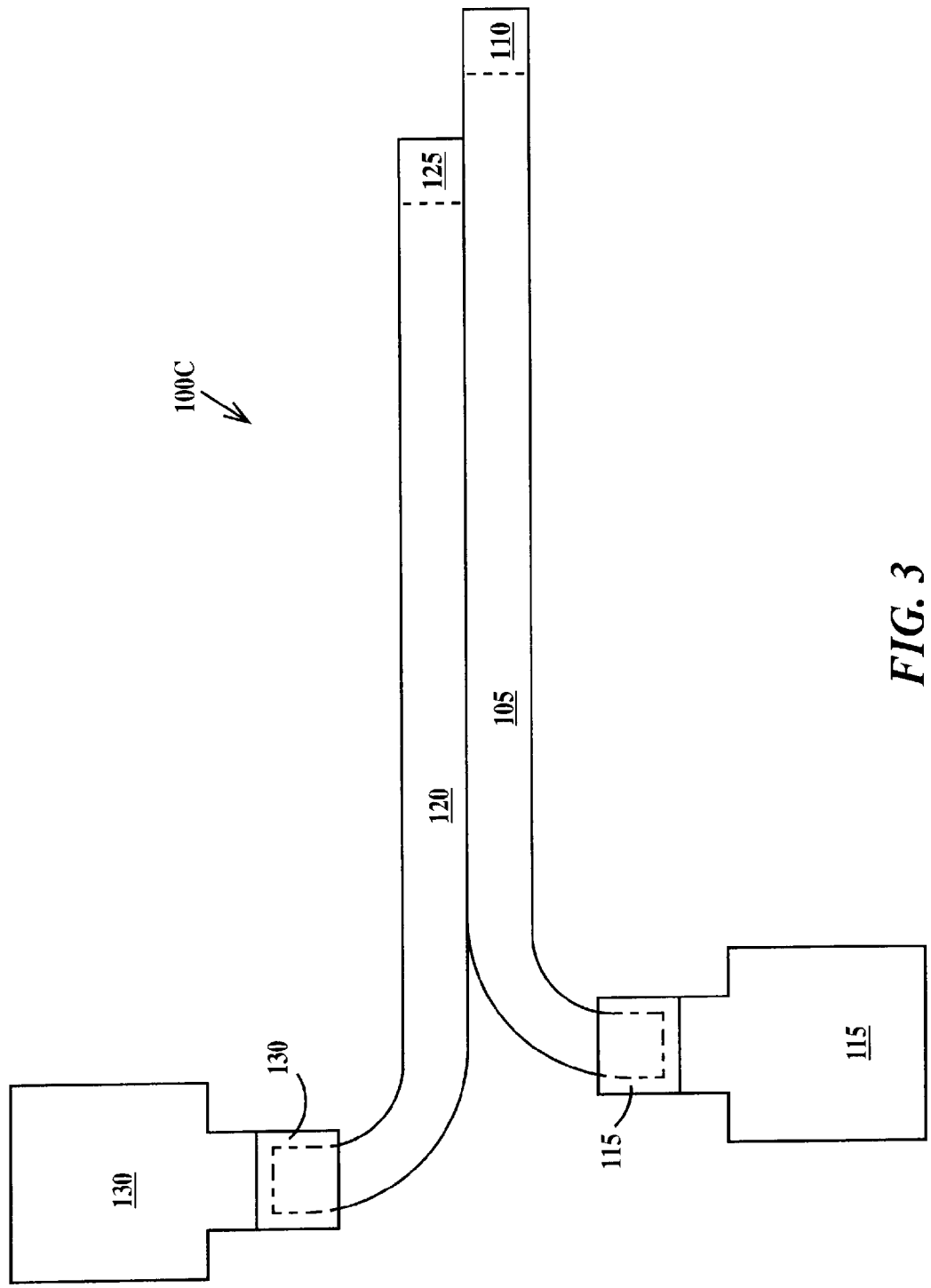
FIG. 3 is a top view of a third CNT diode is according to the present invention.

FIG. 3 is a top view of a third CNT diode is according to the present invention. In FIG. 3A, a CNT diode 100C is similar to CNT diode 100A of FIGS. 2A and 2B, except instead of CNT 120 being on top of CNT 105, they are next to each other and the respective ends opposite catalytic nano-particles 110 and 125 have been bent away from each other. In FIG. 3, CNTs 105 and 120 lie in a same plane that is parallel to the plane defined by the top surface of an insulating layer 135. In one example, bending is performed using an atomic force microscope prior to formation of contacts 115 and 130, Though not shown in FIG. 3, only one of CNTs 105 and 120 needs to be bent, the other may remain straight. Otherwise, fabrication of CNT diode 100C is similar to fabrication of CNT diode 100A described supra.

FIG. 4 is a top view of a fourth CNT diode is according to the present invention. In FIG. 4, a CNT diode 110D is similar to CNT diode of FIGS. 1A and 1B, except there are a multiplicity of substantially parallel first CNTs 105 and a multiplicity of substantially parallel second CNTs 120 forming a multiplicity of diodes D arranged in an array of columns and rows wired in parallel because a single contact 115 electrically contacts every CNT 105 and a single contact 130 electrically contacts every CNT 120. In one example, CNTs 105 are about perpendicular to CNTs 120. The number of CNTs 105 can be as small as one provided the number of CNTs 120 is at least two and vice versa.

FIG. 5 is a top view of a CNT diode array according to the present invention. In FIG. 5, a CNT diode array 150 is similar to CNT diode 100D of FIG. 4, except each CNT 105 is electrically connected to a single contact pad 115 and each CNT 120 is electrically connected to a single contact pad 130. This allows various diode circuits to be easily wired together into circuits, including ESD protection circuits. Additionally, CNT diode array 150 may be tested and defective individual diodes, rows or columns "marked" as defective and not wired into circuits.

FIG. 6A is a top plan view and FIG. 6B is a section view through line 6B-6B of FIG. 6A of a fifth CNT diode according to the present invention. In FIGS. 6A and 6B a CNT diode 100E is similar to CNT diode 100B of FIGS. 2A and 2B except CNT diode 100E includes a multiplicity CNTs 105 and 120. CNTs 105 extend in a lengthwise direction parallel to each other in a first layer that is parallel to the plane defined by the top surface of insulating layer 135 (see FIG. 2B). CNTs 120 extend in the same lengthwise direction as CNTs 105 parallel to each other in a second layer that is parallel to the plane defined by the top surface of insulating layer 135 (see FIG. 2B). Each CNT 105 in the first layer is in electrical contact with one or two CNTs 120 in the second layer (forming a CNT 105/120 group) along a portion of the length of each adjacent CNT 105 and 120 in the group.

Figure 6C:
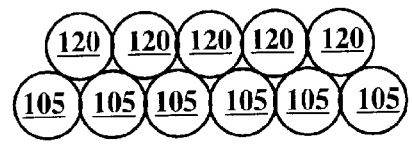
FIG. 6C is a cross-sectional view of an alternative arrangement of CNTs illustrated in FIGS. 6A and 6B.

FIG. 6C is a cross-sectional view of an alternative arrangement of CNTs illustrated in FIGS. 6A and 6B. In FIG. 6C, an alternative arrangement of CNTs 105 and 120 is illustrated where adjacent CNTs 105 are in electrical contact with each other along a portion of the length of each adjacent CNT 105 and adjacent CNTs 120 are in physical and electrical contact with each other along a portion of the length of each adjacent CNT 120.

Figure 7:
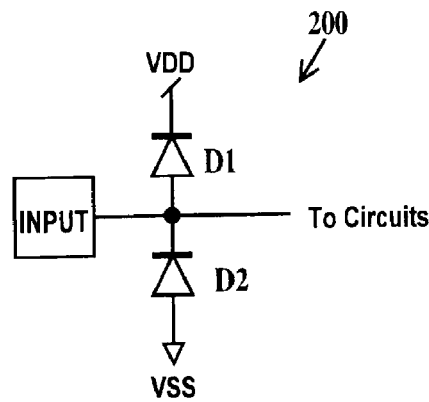
FIG. 7 is a first CNT diode ESD circuit according to the present invention.

FIG. 7 is a first CNT diode ESD circuit according to the present invention. In FIG. 7 an ESD protection circuit 200 includes a first CNT diode D1 and a second CNT diode D2. The cathode of first CNT diode D1 is connected to VDD and to the anode of second CNT diode D2 is connected to VSS (e.g. ground). An input pad is connected to the anode of CNT diode D1 and the cathode of CNT diode D2. Integrated circuits to be protected are connected to the input pad.

Diode arrays DA1 and DA2 are independently selected from the group of diodes arrays consisting of CNT diode array 100D and CNT diode array 150 described supra.

Figure 8:
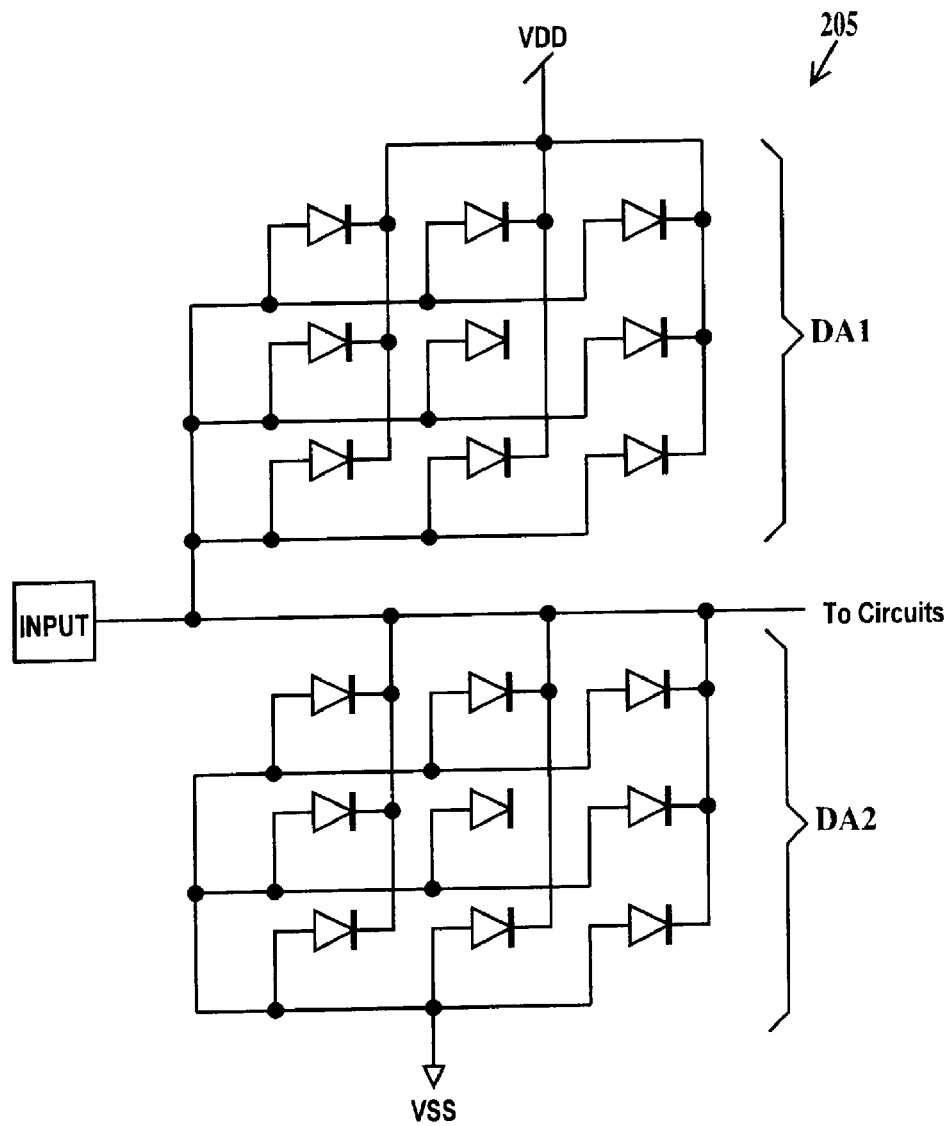
FIG. 8 is a second CNT diode ESD circuit according to the present invention.

FIG. 8 is a second CNT diode ESD circuit according to the present invention. In FIG. 8 an ESD protection circuit 205 includes a first CNT diode array DA1 and a second CNT diode array DA2. The cathodes of each diode of first CNT diode array DA1 are connected to VDD and the anodes each diode of second CNT diode array DA2 are connected to VSS (e.g. ground). An input pad is connected to each anode of each diode of CNT diode array DA1 and to the cathode of each diode of CNT diode array DA2. Integrated circuits to be protected are connected to the input pad. Diode D1 and D2 are independently selected from the group of diodes consisting of CNT diode 100A, CNT diode 100B and CNT diode 100C described supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A diode, comprising:
said diode comprising an anode and a cathode, said anode comprising a p-type single wall carbon nanotube and said cathode comprising an n-type single wall carbon nanotube, said p-type single wall carbon nanotube in direct and constant physical and electrical contact with said n-type single wall carbon nanotube to form a permanent PN junction;
a first metal pad in physical and electrical contact with said p-type single wall carbon nanotube and a second metal pad in physical and electrical contact with said n-type single wall carbon nanotube; and
wherein said p-type single wall carbon nano-tube has an electron-withdrawing charge transfer complex coating.

2. A diode, comprising:
said diode comprising an anode and a cathode, said anode comprising a p-type single wall carbon nanotube and said cathode comprising an n-type single wall carbon nanotube, said p-type single wall carbon nanotube in direct and constant physical and electrical contact with said n-type single wall carbon nanotube to form a permanent PN junction;
a first metal pad in physical and electrical contact with said p-type single wall carbon nanotube and a second metal pad in physical and electrical contact with said n-type single wall carbon nanotube; and
wherein said p-type single wall carbon nano-tube and said n-type single wall carbon nano-tube are parallel to each other, a portion of the length of the p-type single wall carbon nano-tube and a portion of the length said n-type single wall carbon nano-tube in said physical and electrical contact.

3. A diode, comprising:
said diode comprising an anode and a cathode, said anode comprising a multiplicity of p-type single wall carbon nanotubes and said cathode comprising a multiplicity of n-type single wall carbon nanotubes, each of said p-type single wall carbon nanotubes in direct and constant physical and electrical contact with one or two of said n-type single wall carbon nanotubes and each of said n-type single wall carbon nanotubes in physical and electrical contact with one or two of said p-type single wall carbon nanotubes to form permanent PN junctions; and
a first metal pad in physical and electrical contact with every p-type single wall carbon nanotube of said multiplicity of p-type single wall carbon nanotubes and a second metal pad in physical and electrical contact with every n-type single wall carbon nanotube of said multiplicity of p-type single wall carbon nanotubes.

4. The diode of claim 3, wherein:
said first metal pad induces holes as the majority carrier in said p-type single wall carbon nanotubes and said second metal pad induces electrons as the majority carrier in said p-type single wall carbon nanotubes.

5. The diode of claim 3, wherein said first metal pad comprises palladium and said second metal pad comprises aluminum.

6. The diode of claim 3, wherein each n-type single wall carbon nanotube of said multiplicity of n-type single wall carbon nanotubes has an amine rich polymer coating.

7. The diode of claim 3, wherein each p-type single wall carbon nano-tube of said multiplicity of p-type single wall carbon nanotubes has an electron-withdrawing charge transfer complex coating.

8. The diode of claim 3, wherein each p-type single wall carbon nano-tube of said multiplicity of p-type single wall carbon nanotubes crosses each n-type single wall carbon nanotube of said multiplicity of n-type single wall carbon nanotubes at included angles of greater than zero but no greater than 90 degrees, said p-type single wall carbon nanotubes in physical and electrical contact with said n-type single wall carbon nanotubes where said p-type single wall carbon nanotubes cross said n-type single wall carbon nanotubes.

9. The diode of claim 3, wherein:
each p-type single wall carbon nanotube of said multiplicity of p-type single wall carbon nanotubes extends in a lengthwise direction parallel to each other in a first layer;
each n-type single wall carbon nanotube of said multiplicity of n-type single wall carbon nanotubes extends in said lengthwise direction parallel to each other in a second layer; and
each p-type single wall carbon nanotube in said first layer in physical and electrical contact with one or two n-type single wall carbon nanotubes in said second layer along a portion of the length of each pair of contacting n-type and p-type single wall carbon nanotubes.

10. The diode of claim 3, wherein:
each p-type single wall carbon nanotube of said multiplicity of p-type single wall carbon nanotubes extends in a lengthwise direction parallel to each other in a first layer, adjacent p-type single wall carbon nanotube of said multiplicity of p-type single wall carbon nanotubes in electrical contact with each other along portions of lengths of each adjacent p-type single wall carbon nanotube;
each n-type single wall carbon nanotube of said multiplicity of n-type single wall carbon nanotubes extends in said lengthwise direction parallel to each other in a second layer, adjacent n-type single wall carbon nanotube of said multiplicity of n-type single wall carbon nanotubes in electrical contact with each other along portions of lengths of each adjacent n-type single wall carbon nanotube; and
each p-type single wall carbon nanotube in said first layer in physical and electrical contact with one or two n-type single wall carbon nanotubes in said second layer along a portion of the length of each pair of contacting n-type and p-type single wall carbon nanotubes.

11. An electrostatic discharge circuit, comprising:
a first diode according to the diode of claim 8 and a second diode according to the diode of claim 3;
a cathode of a said first diode connected to a high voltage terminal of a power source and an anode of said second diode connected to a low voltage terminal of said power source; an input pad connected to said anode of said first diode, a cathode of said second diode and to circuits to be protected.

12. The diode of claim 3, wherein said first and second metal pads comprise different metals.

13. The diode of claim 3, wherein each p-type single wall carbon of said multiplicity of p-type single wall carbon nanotubes is attached to respective first catalytic nano-particles and each n-type single wall carbon of said multiplicity of n-type single wall carbon nanotubes is attached to respective second catalytic nano-particles.

14. The diode of claim 3, wherein regions of each of said n-type single wall carbon nanotube of said multiplicity of n-type single wall carbon nanotubes and corresponding regions of each of said p-type single wall carbon nanotube of said multiplicity of p-type single wall carbon nanotubes are fixed in physical and electrical contact.

15. A diode, comprising:

said diode comprising an anode and a cathode, said anode comprising a multiplicity of p-type single wall carbon nanotubes spaced apart, each p-type single wall carbon nanotube of said multiplicity of p-type single wall carbon nanotubes extending in a first lengthwise direction and parallel to each other in a first layer and said cathode comprising a multiplicity of n-type single wall carbon nanotubes spaced apart, each n-type single wall carbon nanotube of said multiplicity of n-type single wall carbon nanotubes extending in a second lengthwise direction and parallel to each other in a second layer, said first lengthwise direction about perpendicular to said second lengthwise direction;

first metal pads in physical and electrical contact with respective p-type single wall carbon nanotubes of said multiplicity of p-type single wall carbon nanotubes and second metal pad in physical and electrical contact with respective n-type single wall carbon nanotubes of said multiplicity of p-type single wall carbon nanotubes; and wherein each p-type single wall carbon nano-tube of said multiplicity of p-type single wall carbon nanotubes crosses each n-type single wall carbon nanotube of said multiplicity of n-type single wall carbon nano-tubes at included angles of greater than zero but no greater than 90 degrees, said p-type single wall carbon nanotubes in direct and constant physical and electrical contact with said n-type single wall carbon nanotubes where said p-type single wall carbon nanotubes cross said n-type single wall carbon nanotubes to form permanent PN junctions.

16. The diode of claim 15, wherein said first metal pads comprise palladium and said second metal pads comprise aluminum.

17. The diode of claim 15:

wherein each n-type single wall carbon nanotube of said multiplicity of n-type single wall carbon nanotubes has an amine rich polymer coating; or wherein each p-type single wall carbon nanotube of said multiplicity of p-type single wall carbon nanotubes has an electron-withdrawing charge transfer complex coating; or wherein each n-type single wall carbon nanotube of said multiplicity of n-type single wall carbon nanotubes has an amine rich polymer coating and each p-type single wall carbon nanotube of said multiplicity of p-type single wall carbon nano-tubes has a electron-withdrawing charge transfer complex coating.

18. The diode of claim 15, wherein each of said first metal pads comprise a same first metal, and each of said second metal pads comprise a same second metal, said second metal different from said first metal.

19. The diode of claim 15, wherein each p-type single wall carbon of said multiplicity of p-type single wall carbon nanotubes is attached to respective first catalytic nano-particles and each n-type single wall carbon of said multiplicity of n-type single wall carbon nanotubes is attached to respective second catalytic nano-particles.

20. The diode of claim 15, wherein regions of each of said n-type single wall carbon nanotube of said multiplicity of n-type single wall carbon nanotubes and corresponding regions of each of said p-type single wall carbon nanotube of said multiplicity of p-type single wall carbon nanotubes are fixed in physical and electrical contact.

* * * * *